(12) United States Patent
Yukawa (10) Patent No.: US 10,219,370 B2
(45) Date of Patent: Feb. 26, 2019

(54) DISPLAY UNIT AND ELECTRONIC APPARATUS

(71) Applicant: SONY CORPORATION, Tokyo (JP)

(72) Inventor: Gen Yukawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/828,479

(22) Filed: Dec. 1, 2017

(65) Prior Publication Data

US 2018/0092200 A1 Mar. 29, 2018

Related U.S. Application Data

(63) Continuation of application No. 14/408,129, filed as application No. PCT/JP2013/065145 on May 31, 2013, now Pat. No. 9,854,667.

(30) Foreign Application Priority Data

Jul. 9, 2012 (JP) ................. 2012-153208

(51) Int. Cl.
 *H05K 1/02* (2006.01)
 *G06F 1/16* (2006.01)
 *G06F 9/30* (2018.01)
 *G09F 9/30* (2006.01)

(52) U.S. Cl.
 CPC ........... *H05K 1/028* (2013.01); *G06F 1/1652* (2013.01); *G09F 9/30* (2013.01)

(58) Field of Classification Search
 CPC .......... H05K 1/028; G09F 9/30; G06F 1/1652
 See application file for complete search history.

(56) References Cited

U.S. PATENT DOCUMENTS

| 7,667,962 B2 | 2/2010 | Mullen | |
|---|---|---|---|
| 2005/0285963 A1* | 12/2005 | Misawa | H04N 5/2251 348/333.06 |
| 2006/0262098 A1* | 11/2006 | Okamoto | G06F 3/0488 345/173 |
| 2007/0275249 A1 | 11/2007 | Yen et al. | |
| 2010/0188189 A1 | 9/2010 | Bald et al. | |
| 2010/0315399 A1 | 12/2010 | Jacobson et al. | |
| 2011/0188189 A1 | 8/2011 | Park et al. | |

(Continued)

FOREIGN PATENT DOCUMENTS

| CN | 102142207 A | 8/2011 |
|---|---|---|
| EP | 2355631 A | 8/2011 |
| JP | 2005-354305 A | 12/2005 |

(Continued)

OTHER PUBLICATIONS

Office Action for CN Patent Application No. 2014-524690, dated Mar. 21, 2017, 05 pages of Office Action and 05 pages of English Translation.

(Continued)

*Primary Examiner* — William H Mayo, III
*Assistant Examiner* — Hiram E Gonzalez
(74) *Attorney, Agent, or Firm* — Chip Law Group (57) ABSTRACT

A display unit includes: a display section (11) having flexibility; and a bending control section (12a, 12b) configured to limit a movable shaft in bending the display section (11) to one direction in a display surface and allowed to maintain the display section (11) in an arbitrary bending state.

22 Claims, 5 Drawing Sheets

(56) References Cited

U.S. PATENT DOCUMENTS

2013/0131887 A1   5/2013   Park
2013/0169520 A1   7/2013   Cho et al.

FOREIGN PATENT DOCUMENTS

| JP | 2006-163099 A | 6/2006 |
| JP | 2006-330082 A | 12/2006 |
| JP | 2009-049934 A | 3/2009 |
| JP | 2010-157060 A | 7/2010 |
| JP | 2010-218102 A | 9/2010 |
| KR | 10-2011-0088870 A | 8/2011 |

OTHER PUBLICATIONS

Notice of Allowance for U.S. Appl. No. 14/408,129, dated Aug. 23, 2017, 08 pages.
Non-Final Office Action for U.S. Appl. No. 14/408,129, dated Mar. 2, 2017, 13 pages.
Final Office Action for U.S. Appl. No. 14/408,129, dated Oct. 14, 2016, 10 pages.
Non-Final Office Action for U.S. Appl. No. 14/408,129, dated Apr. 8, 2016, 13 pages.
International Preliminary Report on Patentability of PCT Application No. PCT/JP2013/065145, dated Jan. 22, 2015, 07 pages of English Translation and 05 pages of IPRP.
International Search Report and Written Opinion of PCT Application No. PCT/JP2013/065145, dated Aug. 6, 2013, 07 pages of English Translation and 08 pages of ISRWO.

\* cited by examiner

DISPLAY UNIT AND ELECTRONIC APPARATUS

CROSS-REFERENCE TO RELATED APPLICATION

The present application is a continuation application of U.S. patent application Ser. No. 14/408,129, filed Dec. 15, 2014, which is a National Stage of PCT/JP2013/065145, filed May 31, 2013, and claims the benefit of priority from prior Japanese Patent Application JP 2012-153208, filed Jul. 9, 2012, the entire content of which is hereby incorporated by reference.

TECHNICAL FIELD

The present disclosure relates to a display unit having flexibility such as a so-called electronic paper, and an electronic apparatus including such a display unit.

BACKGROUND ART

In recent years, various developments of ultraslim display units called electronic papers (e-papers) have been carried out by various manufacturers (for example, refer to PTLs 1 and 2). For example, in PTL 1, a so-called electronic book (e-book) using such a display unit as a book is proposed.

CITATION LIST

Patent Literature

PTL 1: Japanese Unexamined Patent Application Publication No. 2010-218102
PTL 2: Japanese Unexamined Patent Application Publication No. 2010-157060

SUMMARY OF INVENTION

Since the above-described display unit is thin and highly flexible, the display unit is allowed to be physically bent or twisted. Therefore, various user interfaces such as a user interface in which a sensor configured to detect a bend or the like by a user is mounted to switch display contents by such a user operation are achievable. Therefore, in such a display unit having flexibility, an improvement in convenience to users is generally desired.

Thus, it is desirable to provide a display unit and an electronic apparatus that are capable of improving convenience to users.

A display unit of an embodiment of the present disclosure includes: a display section having flexibility; and a bending control section configured to limit a movable shaft in bending the display section to one direction in a display surface and allowed to maintain the display section in an arbitrary bending state.

An electronic apparatus of an embodiment of the present disclosure includes the above-described display unit of the embodiment of the present disclosure.

In the display unit and the electronic apparatus of the embodiments of the present disclosure, the movable shaft in bending the display section having flexibility is limited to one direction in the display surface. Therefore, the display section is less prone to breakage, and a display image on the display section is easily viewed. Moreover, the bending control section is allowed to maintain the display section in the arbitrary bending state; therefore, the display unit and the electronic apparatus are allowed to be used at an arbitrary bending degree including a flat state when in use (when an display image is viewed) and when not in use (for example, when the electronic book is stored or carried in a folded state).

According to the display unit and the electronic apparatus of the embodiments of the present disclosure, the bending control section configured to limit the movable shaft in bending the display section to one direction in the display surface and allowed to maintain the display section in the arbitrary bending state is provided; therefore, while the display section is less prone to breakage, an display image is allowed to be easily viewed, and use at an arbitrary bending degree is achievable. Therefore, in the display unit having flexibility, convenience to users is allowed to be improved.

BRIEF DESCRIPTION OF DIAGRAMS

DESCRIPTION OF EMBODIMENTS

Some embodiments of the present disclosure will be described in detail below referring to the accompanying drawings. It is to be noted that description will be given in the following order.

1. Embodiment (An example of an electronic book including a bending control section configured with use of a flexible supporting member)
2. Modification Examples (Another configuration example of the bending control section, an example of another electronic book, and the like)

Embodiment

Figure 1:
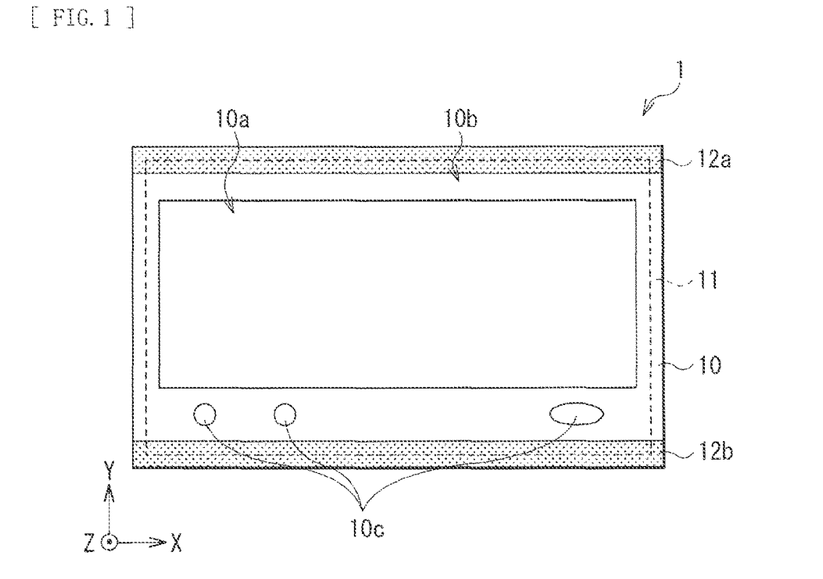
FIG. 1 is a schematic plan view illustrating a schematic configuration example of an electronic book as a display unit or an electronic apparatus according to an embodiment of the present disclosure.

[Schematic Configuration of Electronic Book 1]
FIG. 1 schematically illustrates a schematic configuration of an electronic book 1 as a display unit or an electronic apparatus according to an embodiment of the present disclosure in a plan view (an X-Y plan view). The electronic book 1 is a thin flexible display formed by making components of a soft material. In this electronic book 1, like an actual book formed by binding a plurality of pieces of paper (pages), an entire apparatus is allowed to be closed (folded) or opened. A user is allowed to browse contents (for example, a page of a book, or the like) displayed on the electronic book 1 while having a feeling of actually reading a book. The electronic book 1 includes a display section 11, an enclosure 10, and a pair of flexible supporting members 12a and 12b (bending control sections).

(Display Section 11)

The display section 11 is a display panel configured to display an image, based on an image signal, and may have, for example, a configuration in which an organic electroluminescence device (an organic EL device), a liquid crystal display device, an electrophoretic device, or the like is sandwiched by a resin film such as plastic. The display section 11 has flexibility, and is configured with use of a drive device configured of an organic TFT (Thin Film Transistor), and the like in addition to the above-described various kinds of display devices. It is to be noted that such a display section 11 has an anisotropic shape (a rectangular shape) in which, an X-axis direction and a Y-axis direction herein refer to a long-shaft direction and a short-shaft direction, respectively.

(Enclosure 10)

The enclosure 10 is an exterior member that has flexibility and is configured to contain the display section 11 in a visible manner. More specifically, the enclosure 10 is configured of a resin film (a transparent film) having softness and transparency (light transmittance) to display light, for example, a material such as an olefin-based resin. Moreover, the enclosure 10 includes a transparent display region 10a (an effective display region) allowing the display section 11 to be visible and a frame region 10b that is located in a periphery (an outer edge) of the display region 10b and is not transparent. An operation section 10c (an operation button or the like) used by the user to operate the electronic book 1 is provided to the frame region 10b. It is to be noted that such an enclosure 10 also has an anisotropic shape (a rectangular shape) in which the X-axis direction and the Y-axis direction refer to a long-shaft direction and a short-shaft direction, respectively, based on the anisotropic shape (the rectangular shape) of the display section 11.

(Flexible Supporting Members 12a and 12b)

Figure 2A:
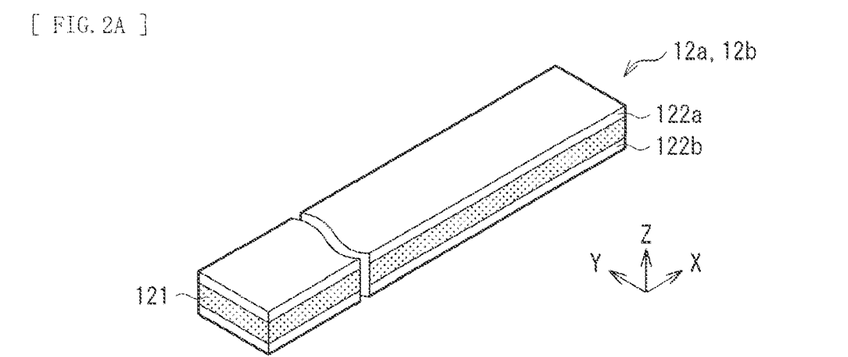
FIG. 2A is a schematic perspective view for describing a specific configuration and functions of a flexible supporting member illustrated in FIG. 1.

For example, as illustrated in FIG. 2A, each of the flexible supporting members 12a and 12b may include a core 121 that extends along a predetermined direction (the X-axis direction in this case) and is freely deformable and a pair of control members 122a and 122b that are so provided on a front surface side and a back surface side (on both surface sides along the Y-axis direction) of the core as to sandwich the core 121 therebetween. In other words, in each of the flexible supporting members 12a and 12b, the core 121 is sandwiched between the rectangular (plate-like) control members 122a and 122b. Therefore, each of the flexible supporting members 12a and 12b has a shape extending along the X-axis direction as a whole.

Each of the control members 122a and 122b is a member configured to control (define) a deformation direction of the core 121 to one predetermined direction that will be described later, and may be made of a material having softness such as SUS (Steel Use Stainless; stainless steel). On the other hand, the core 121 may be made of, for example, a heavy metal material such as lead (Pb). However, when an environmental load or the like in disposal or the like is considered, instead of such a heavy metal material, the core 12 may be desirably configured with use of the following resin material. In other words, for example, the core 12 may be desirably configured with use of a stretched olefin-based resin sheet, or may be desirably configured by combining (laminating) such a resin sheet and a thermoplastic resin film. In a case where the core 121 is configured with use of such a resin material, as described above, while an environmental load in disposal or the like is allowed to be reduced, the core 121 is allowed to cope with a smaller bending diameter (radius of curvature), and resistance to repeated use is enhanced (resistance to such use is improved). Moreover, in a case where the core 121 is configured with use of such a resin material, the deformation direction of the core 121 is allowed to be controlled to a laminate direction (directivity is provided to the deformation direction); therefore, the control members 122a and 122b made of the above-described SUS or the like are not necessary. It is to be noted that these members in the flexible supporting members 12a and 12b are expected to exhibit a property of being easily charged; therefore, as measures against charging, an antistatic member (not illustrated) may be further provided in the flexible supporting members 12a and 12b.

Figure 2B:
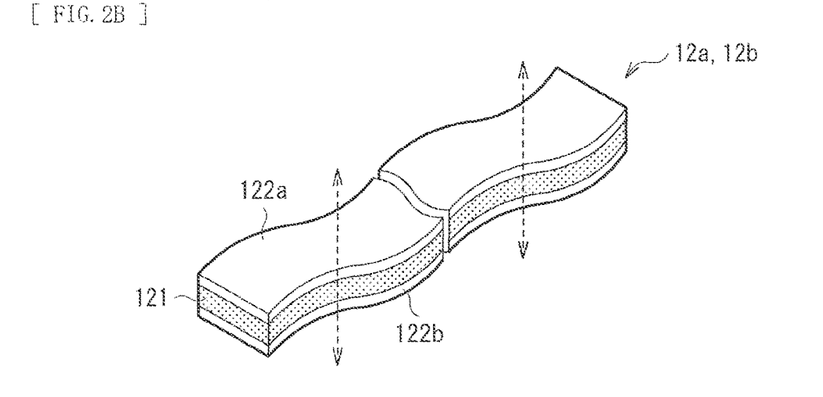
FIG. 2B is another schematic perspective view for describing the specific configuration and functions of the flexible supporting member illustrated in FIG. 1.

By such a configuration, for example, as illustrated in FIG. 2B, each of the flexible supporting members 12a and 12b is freely deformable in an arbitrary shape along the one predetermined direction (the Z-axis direction in this case). In other words, each of the flexible supporting members 12a and 12b is so configured as to be deformable in an arbitrary curve in a Z-X plane in this case.

In this case, as illustrated in FIG. 1, each of the flexible supporting members 12a and 12b is attached on (attached along) the enclosure 10. Specifically, these flexible supporting members 12a and 12b are so disposed on both ends along the Y-axis direction of the enclosure 10 in a display surface (an X-Y plane) as to extend along the X-axis direction. More specifically, the flexible supporting member 12a is so disposed in a portion above the display region 10a of the frame region 10b in the enclosure 10 as to extend along the X-axis direction. The flexible supporting member 12b is so disposed in a portion below the display region 10a of the frame region 10b in the enclosure 10 as to extend along the X-axis direction.

By such a configuration, each of the flexible supporting members 12a and 12b is allowed to limit a movable shaft in bending (warping) the display section 11 to one direction (the X-axis direction in this case) in the display surface, and is allowed to maintain (fix) the display section 11 in an arbitrary bending state (warp state). More specifically, one shaft of a long shaft (an X axis) and a short shaft (a Y axis) in the display section 11 is a movable shaft, and the other shaft is a fixed shaft. In this electronic book 1, as an example, the long shaft (the X axis) and the short shaft (the Y axis) in the display section 11 are the movable shaft and the fixed shaft, respectively. In other words, while the electronic book 1 is allowed to be bent in a thickness direction (the Z-axis direction) thereof by moving the long shaft, the short shaft is the fixed shaft; therefore, the electronic book 1 is not allowed to be bent by moving the short shaft. However, contrary to this example, the short shaft (the Y axis) and the long shaft (the X axis) in the display section 11 may be the movable shaft and the fixed shaft, respectively. In this case, while the electronic book 1 is allowed to be bent in the thickness direction (the Z-axis direction) thereof by moving the short shaft, the long shaft is the fixed shaft; therefore, the electronic book 1 is not allowed to be bent by moving the long shaft.

Moreover, a holding structure configured to hold a diameter (a bending diameter) in bending each of the flexible supporting members 12a and 12b at a predetermined threshold value (a bending threshold value) or more (a structure configured to prevent the bending diameter from being less than the bending threshold value) is provided to each of the flexible supporting members 12a and 12b. More specifically, the structure is so configured as not to be bendable at a diameter less than diameters of the flexible supporting members 12a and 12b.

[Functional Block Configuration of Electronic Book 1]

Figure 3:
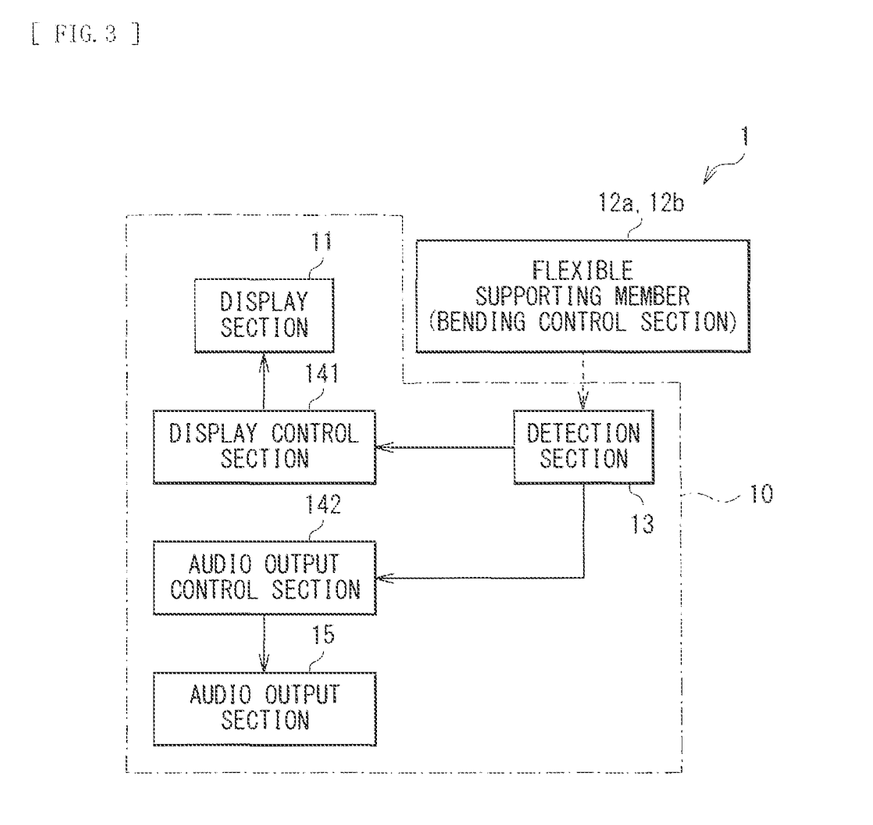
FIG. 3 is a block diagram illustrating a schematic configuration example of the electronic book illustrated in FIG. 1.

Next, FIG. 3 illustrates an example of a functional block configuration of such an electronic book 1. The electronic book 1 may include, for example, the display section 11, a detection section 13, a display control section 141, an audio output control section 142, and an audio output section 15 in the enclosure 10, and includes the above-described pair of flexible supporting members 12a and 12b (bending control sections).

The detection section 13 is configured to indirectly detect a bend or the like of the electronic book 1 (the display section 11) by an operation or the like by a user, for example, by detecting bending positions and bending degrees (bending diameters) of the flexible supporting members 12a and 12b, and is configured with use of a predetermined bending sensor or the like. Examples of such a bending sensor may include an acceleration sensor, a force sensor, a pressure sensor, a strain sensor, and a gyro sensor. Thus, the detection section 13 is allowed to detect, for example, whether or not the bending diameter in the flexible supporting members 12a and 12b is reduced to near the above-described predetermined bending threshold value (a bending diameter $Rc > a$ bending threshold value $Rth$, and $Rc \sim Rth$). It is to be noted that, in this case, a detection result by the detection section 13 is output to the display control section 141 and the audio output control section 142.

The display control section 141 is configured to perform control (display control) to supply an image signal to the display section 11 from one pixel to another and display an image on the display section 11.

The audio output section 15 is allowed to output predetermined sound, and may be configured with use of, for example, a speaker.

The audio output control section 142 is configured to perform control (audio control) to supply an audio signal to the audio output section 15 and output sound by the audio output section 15.

In this case, in the electronic book 1 of this embodiment, when the detection section 13 detects that the bending diameters $Rc$ of the flexible supporting members 12a and 12b are reduced to near the predetermined bending threshold value $Rth$ (when such a detection result is input from the detection section 13), the electronic book 1 has a function of giving a warning about that to the outside. More specifically, a warning that the flexible supporting members 12a and 12b are bent near the limit is given by the display control section 141 with use of the display section 11 or by the audio output control section 142 with use of the audio output section 15. In other words, the display control section 141, the audio output control section 142, the display section 11, and the audio output section 15 correspond to specific examples of "warning section" in the present disclosure. It is to be noted that such a warning operation will be described in detail later.

[Functions and Effects of Electronic Book 1]

In this electronic book 1, each of the display section 11, the enclosure 10, and the flexible supporting members 12a and 12b is made of a soft material (has flexibility). Therefore, the user is allowed to open or close the electronic book 1 in a same way as that the user treats an actual book made of paper. For example, when an image (for example, an image indicating one page of a book) is displayed on the display section 11 in a state in which the electronic book 1 is opened, the user is allowed to read the page while holding the electronic book 1 in both hands or one hand or while having (placing) the electronic book 1 open on a table or the like.

(Functions by Flexible Supporting Members 12a and 12b)

Figure 4A:
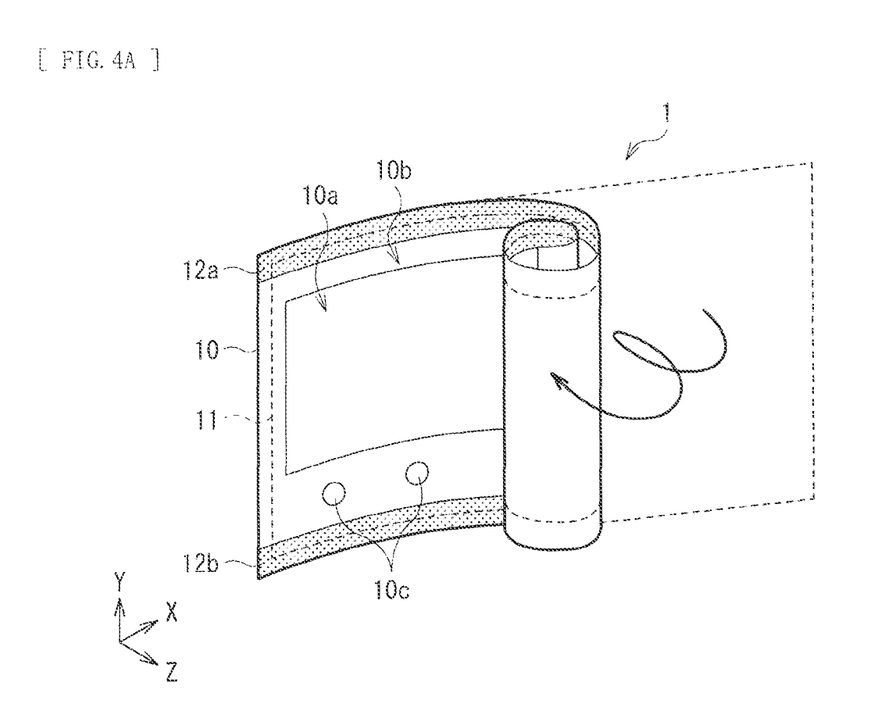
FIG. 4A is a schematic perspective view for describing functions of the electronic book illustrated in FIG. 1.

For example, as illustrated in FIG. 4A, the movable shaft in bending the display section 11 is limited to one direction (the Y-axis direction in this case) in the display surface by free deformation characteristics along one direction of the flexible supporting members 12a and 12b, for example, as illustrated in FIG. 2B. In other words, while the electronic book 1 is allowed to be bent in the thickness direction (the Z-axis direction) thereof by moving the long shaft, the short shaft is the fixed shaft; therefore, the electronic book 1 is not allowed to be bent by moving the short shaft (the Y axis). Therefore, compared to a case where the display section 11 is allowed to be bent (warped) in an arbitrary direction, the display section 11 is less prone to breakage, and a display image on the display section 11 is more easily viewed.

Figure 4B:
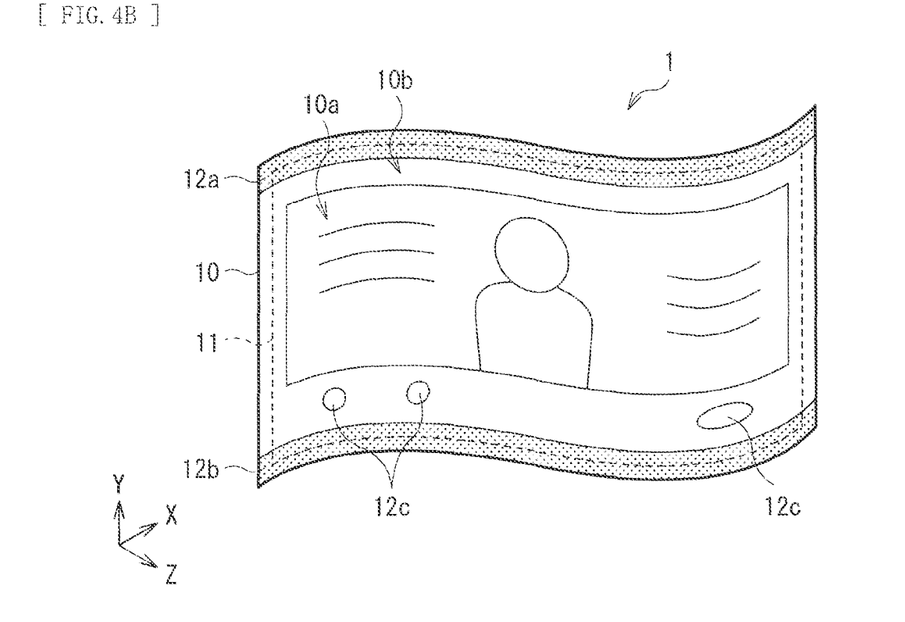
FIG. 4B is a schematic perspective view for describing functions of the electronic book illustrated in FIG. 1.

Moreover, the display section 11 is allowed to be maintained in an arbitrary bending state (warp state) by these flexible supporting members 12a and 12b. Therefore, the electronic book 1 is allowed to be used at an arbitrary bending degree including a flat state when in use, for example, as illustrated in FIG. 4B (when an display image is viewed) and when not in use, for example, as illustrated in FIG. 4A (for example, when the electronic book is stored or carried in a folded state). In other words, the electronic book 1 (the display section 11) is allowed to be maintained in an arbitrary bending shape (however, as described above, a bending shape with use of the X axis as the movable shaft in this case) depending on a convenient bending mode for the user. As a result, the user is allowed to easily treat the electronic book 1 while having a feeling of carrying, for example, a mat or the like instead of a feeling of carrying a plate-like apparatus.

(Warning Operation)

Moreover, in this electronic book 1, when the flexible supporting members 12a and 12b are bent near the limit, a warning about that is given to the outside. More specifically, when the detection section 13 detects that the bending diameters $Rc$ of the flexible supporting members 12a and 12b are reduced to near the bending threshold value $Rth$, the electronic book 1 gives a warning to the outside with use of one or both of image display by the display section 11 and audio output by the audio output section 15.

Figure 5:
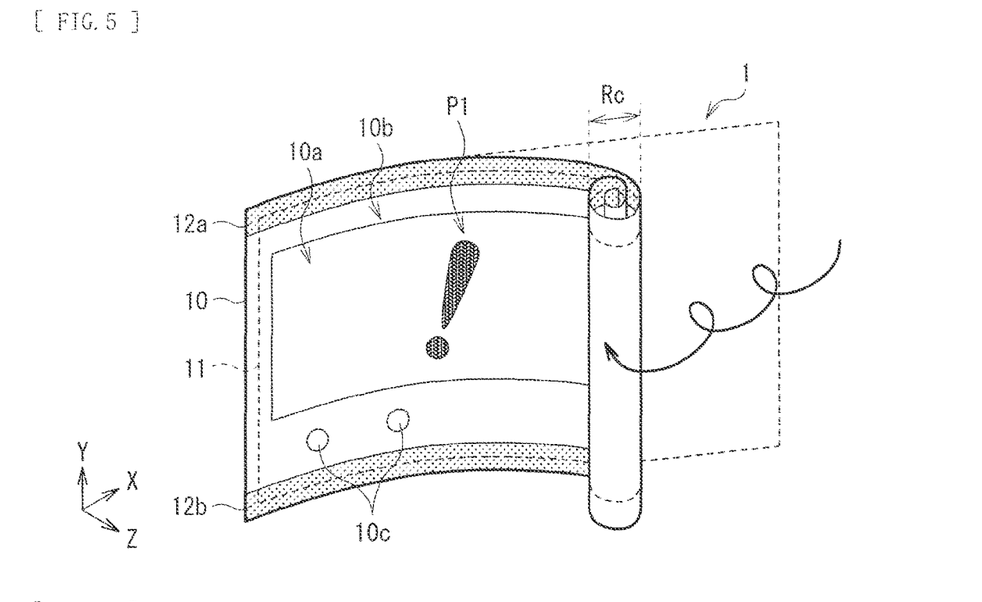
FIG. 5 is a schematic perspective view illustrating an example of a warning operation in the electronic book illustrated in FIG. 1.

In other words, for example, as illustrated in FIG. 5, when it is detected that the bending diameters $Rc$ of the flexible supporting members 12a and 12b are bent near the limit, the display control section 141 performs display control on the display section 11 to display a predetermined warning on the display section 11 (refer to a reference numeral P1 in FIG. 5).

Figure 6:
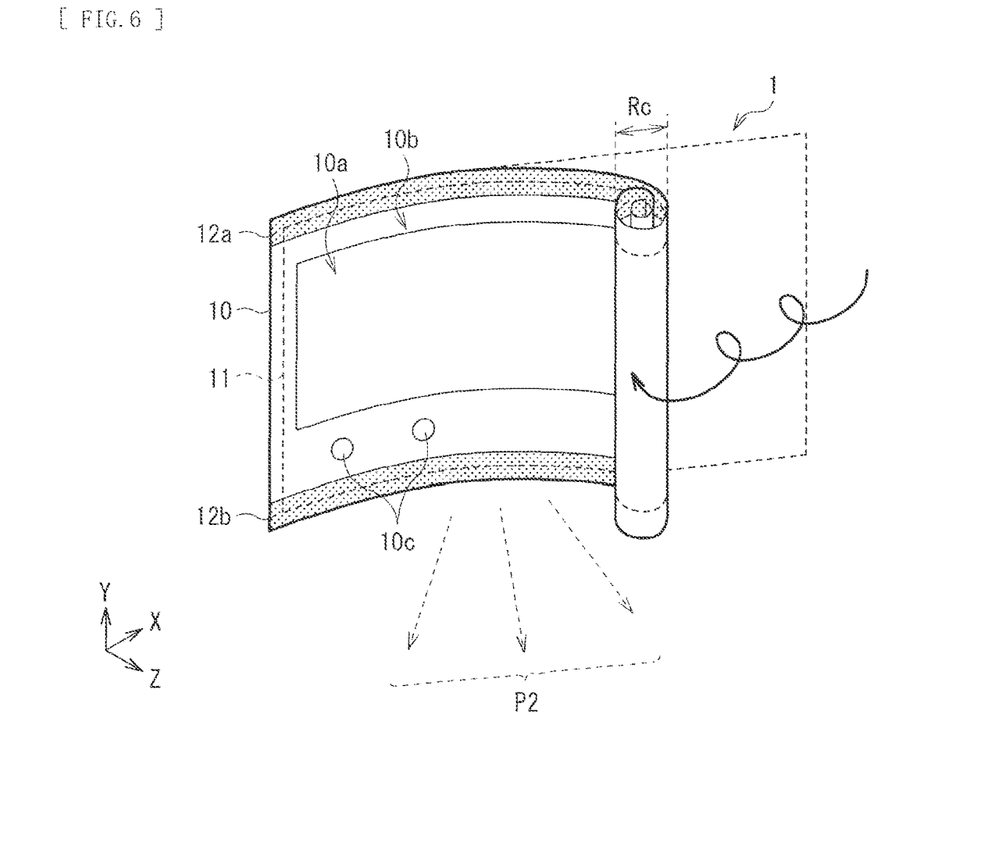
FIG. 6 is a schematic perspective view illustrating another example of the warning operation in the electronic book illustrated in FIG. 1.

Alternatively, for example, as illustrated in FIG. 6, when it is detected that the bending diameters $Rc$ of the flexible supporting members 12a and 12b are bent near the limit, the audio output control section 142 performs audio output control on the audio output section 15 to output predetermined warning sound by the audio output section 15 (refer to a reference numeral P2 in FIG. 6).

The user is allowed to recognize, by such a warning operation, that there is a possibility that the electronic book 1 (the flexible supporting members 12a and 12b) is broken when the electronic book 1 (the flexible supporting members 12a and 12b) is bent more; therefore, breakage of the electronic book 1 is allowed to be prevented.

As described above, in this embodiment, while the movable shaft in bending the display section 11 is limited to one direction in the display surface, the flexible supporting members 12a and 12b (the bending control sections) capable of maintaining the display section 11 in an arbitrary bending state are provided; therefore, while the display section 11 is less prone to breakage, a display image is allowed to be easily viewed, and use at an arbitrary bending degree is achievable. Therefore, in the electronic book 1 (the display unit or the electronic apparatus) having flexibility, convenience to user is allowed to be improved.

Moreover, such bending control is performed with use of the flexible supporting members 12a and 12b; therefore, the flexible supporting members 12a and 12b are allowed to be fabricated at low cost, because the configurations of the flexible supporting members 12a and 12b are simple.

(Modification Examples)

Although the technology of the present disclosure is described referring to the embodiment, the present technology is not limited thereto, and may be variously modified.

For example, in the above-described embodiment, a case where the "bending control section" in the present disclosure is configured with use of the flexible supporting members is described as an example; however, the present technology is not limited thereto. Specifically, for example, the bending control section may be configured with use of any other member such as memory metal, artificial muscle, and an air burr.

Figure 7A:
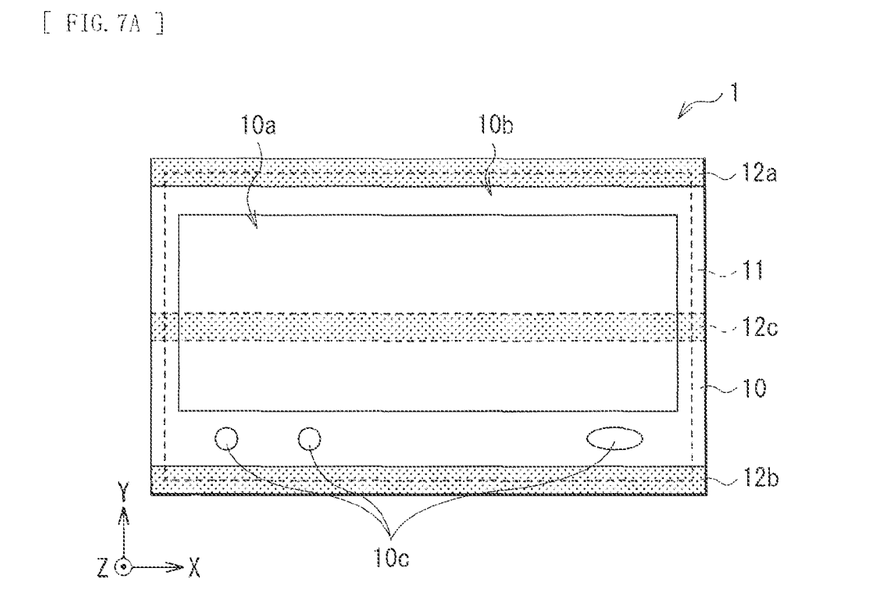
FIG. 7A is a schematic plan view illustrating a schematic configuration example of an electronic book according to a modification example.
Figure 7B:
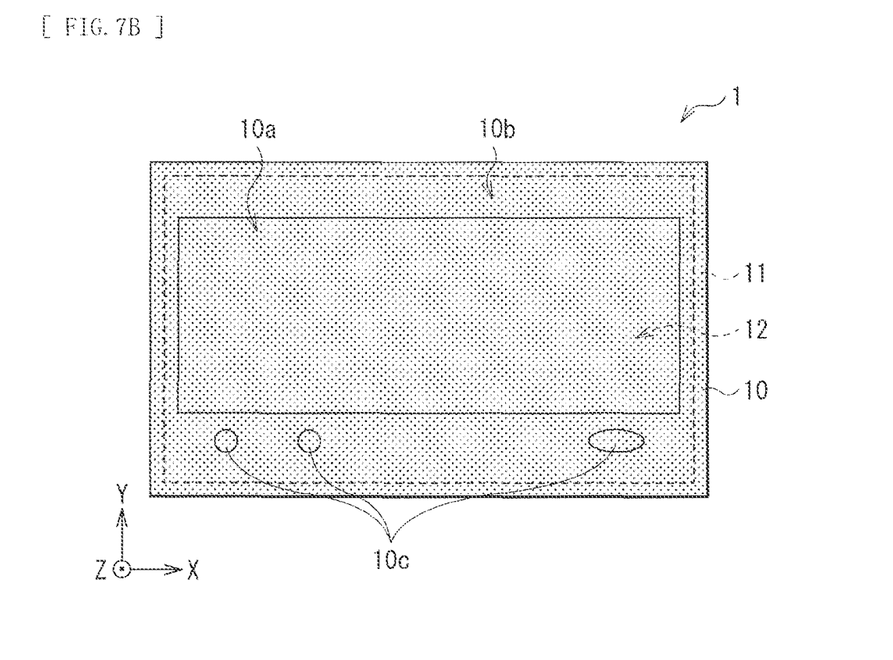
FIG. 7B is a schematic plan view illustrating a schematic configuration example of another electronic book according to the modification example.

Moreover, the arrangement mode of the bending control sections (the flexible supporting members) is not limited to that described in the above-described embodiment, and any other arrangement mode may be adopted. For example, like the electronic book 1 illustrated in FIG. 7A, three or more bending control sections (three flexible supporting members 12a, 12b, and 12c in this case) may be so provided in the display surface (the X-Y plane) as to extend along a movable shaft (the X-axis direction in this case). Alternatively, like the electronic book 1 illustrated in FIG. 7B, a single bending control section (a single flexible supporting member 12 in this case) may be uniformly provided on an entire surface (a back surface side in this case) of the electronic book 1. Moreover, for example, the bending control section may not be attached on the enclosure, but may be provided to the display section (on the display section).

Further, in the above-described embodiment, a case where each of the display section and the enclosure has an anisotropic shape (a rectangular shape) is described as an example; however, the present technology is not limited thereto, and each of the display section and the enclosure may have any other shape, for example, any of various shapes such as a square shape, any other polygonal shape, a circular shape, and an oval shape.

In addition, in the above-described embodiment and the like, the electronic book is cited as an example of the display unit or the electronic apparatus of the present disclosure; however, the display unit or the electronic apparatus of the present disclosure is not limited thereto. In other words, the display unit or the electronic apparatus of the present disclosure may be used for electronic apparatuses such as various portable apparatuses (notebook PCs (Personal Computers), portable audio players, cellular phones, and PDAs (Personal Digital Assitants). Moreover, the display unit and the electronic apparatus of the present disclosure may be generally used not only as a book reader but also as a display unit or an electronic apparatus allowing the user to browse a music player, a video player, a photo viewer, a map application, a web browser, and the like.

It is to be noted that the present technology is allowed to have following configurations.

(1) A display unit including:

a display section having flexibility; and a bending control section configured to limit a movable shaft in bending the display section to one direction in a display surface and allowed to maintain the display section in an arbitrary bending state.

(2) The display unit according to (1), including an enclosure having flexibility and containing the display section in a visible manner, in which the bending control section is attached on the enclosure.

(3) The display unit according to (2), in which each of the display section and the enclosure has an anisotropic shape having a long shaft and a short shaft, and one shaft of the long shaft and the short shaft is the movable shaft, and the other shaft is a fixed shaft.

(4) The display unit according to (3), in which the long shaft as the one shaft is the movable shaft, and the short shaft as the other shaft is the fixed shaft.

(5) The display unit according to (3), in which the short shaft as the one shaft is the movable shaft, and the long shaft as the other shaft is the fixed shaft.

(6) The display unit according to any one of (3) to (5), in which each of the display section and the enclosure has a rectangular shape, and the bending control section is provided to extend along the movable shaft at each of both ends along the fixed shaft of the enclosure.

(7) The display unit according to any one of (2) to (6), in which the enclosure is configured with use of a transparent film.

(8) The display unit according to any one of (1) to (7), in which the bending control section has a holding structure configured to hold a bending diameter thereof at a predetermined threshold value or more.

(9) The display unit according to (8), including a warning section configured to give a warning to the outside when it is detected that the bending diameter is reduced to near the threshold value.

(10) The display unit according to (9), in which the warning section gives a warning to the outside by using one or both of image display by the display section or audio output.

(11) The display unit according to any one of (1) to (10), in which the bending control section is configured with use of a flexible supporting member.

(12) The display unit according to any one of (1) to (11), in which the display section is configured with use of an organic electroluminescence device, a liquid crystal device, or an electrophoretic device.

(13) An electronic apparatus provided with a display unit, the display unit including:

a display section having flexibility; and a bending control section configured to limit a movable shaft in bending the display section to one direction in a display surface and allowed to maintain the display section in an arbitrary bending state.

The present disclosure contains subject matter related to that disclosed in Japanese Priority Patent Application No. 2012-153208 filed in the Japan Patent Office on Jul. 9, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit, comprising:
   a flexible display panel configured to display an image based on an image signal;
   a supporting member configured to:
      maintain the flexible display panel in a fixed bending state along a first direction, and
      maintain the flexible display panel in a flat state along a second direction that is perpendicular to the first direction;
   an exterior member that includes a transparent material and a non-transparent frame member, wherein the transparent material corresponds to a transparent display region, and the non-transparent frame member corresponds to a peripheral region that surrounds the transparent display region; and
   wherein the transparent display region is arranged to cover the flexible display panel with the exterior member in a visible manner through the transparent display region, and
   the supporting member includes a laminated structure that includes a first layer and a second layer.

2. The display unit according to claim 1, further comprising an input device that includes an operation button.

3. The display unit according to claim 1, wherein the transparent material includes a resin.

4. The display unit according to claim 3, wherein the transparent material is a resin film.

5. The display unit according to claim 1, wherein the supporting member includes an antistatic member.

6. The display unit according to claim 1, wherein the supporting member is further configured to maintain the flexible display panel in an arbitrary bending state along the first direction.

7. The display unit according to claim 1, wherein the supporting member is arranged on a substantially entire back surface of the flexible display panel.

8. The display unit according to claim 1, further comprising an input device that includes a plurality of operation buttons arranged along the second direction.

9. The display unit according to claim 1, wherein the supporting member is further configured to issue a warning based on a bending diameter of the flexible display panel that reaches a bending threshold value.

10. The display unit according to claim 1, wherein the first layer is a core that extends along the first direction.

11. The display unit according to claim 10, wherein the core is composed of a resin material.

12. The display unit according to claim 10, wherein the laminated structure further includes a third layer, and wherein the second layer is on a front surface side of the first layer and the third layer is on a back surface side of the first layer, such that the first layer is sandwiched between the second layer and the third layer.

13. The display unit according to claim 12, wherein the first layer is made of a resin material, and the second layer is made of a metal material.

14. The display unit according to claim 1, wherein the flexible display panel and an enclosure of the display unit are bendable along a first axis and are fixed along a second axis.

15. The display unit according to claim 14, wherein the bendability of the flexible display panel is limited along the first direction to maintain the flexible display panel in the fixed bending state along the first direction.

16. The display unit according to claim 1, wherein the first layer is made of a resin material, and the second layer is made of a metal material.

17. The display unit according to claim 16, wherein the laminated structure further includes a third layer made of the metal material, and wherein the second layer is on a front surface side of the first layer and the third layer is on a back surface side of the first layer, such that the first layer is sandwiched between the second layer and the third layer.

18. A display unit, comprising:
    a flexible display panel configured to display an image based on an image signal;
    a supporting member configured to:
       maintain the flexible display panel in a fixed bending state along a first direction, and
       maintain the flexible display panel in a flat state along a second direction that is perpendicular to the first direction; and
    an enclosure that contains the flexible display panel;
    wherein the supporting member and the enclosure are configured such that (i) a transparent display region is arranged to cover the flexible display panel in a visible manner through the transparent display region, and (ii) a non-transparent peripheral region surrounds the transparent display region,
    the supporting member includes a laminated structure that includes a first layer and a second layer, and
    the flexible display panel includes an organic electroluminescence device and a thin film transistor.

19. The display unit according to claim 18, wherein the supporting member is further configured to entirely cover the flexible display panel.

20. The display unit according to claim 18, wherein the laminated structure further includes a third layer, and wherein the second layer is on a front surface side of the first layer and the third layer is on a back surface side of the first layer, such that the first layer is sandwiched between the second layer and the third layer.

21. The display unit according to claim 18, wherein the first layer is made of a resin material, and the second layer is made of a metal material.

22. The display unit according to claim 18, wherein the laminated structure further includes a third layer made of a metal material, and wherein the second layer is on a front surface side of the first layer and the third layer is on a back surface side of the first layer, such that the first layer is sandwiched between the second layer and the third layer.

* * * * *